United States Patent [19]
Kim et al.

[11] Patent Number: 6,080,593
[45] Date of Patent: Jun. 27, 2000

[54] METHOD OF MANUFACTURING FERROELECTRIC MEMORY

[75] Inventors: Dae-sig Kim, Sungnam; Il-sub Chung, Seoul, both of Rep. of Korea

[73] Assignee: Samsung Electronics Co., Ltd., Suwon, Rep. of Korea

[21] Appl. No.: 09/123,424

[22] Filed: Jul. 28, 1998

[30] Foreign Application Priority Data

Jul. 28, 1997 [KR] Rep. of Korea ................. 97-35599

[51] Int. Cl.[7] .................................................. H01L 21/00
[52] U.S. Cl. ............................................................. 438/3
[58] Field of Search ................................ 438/3; 365/145, 365/149; 257/295, 297, 506, 296; 428/701, 688

[56] References Cited

U.S. PATENT DOCUMENTS 5,401,680 3/1995 Abt et al. ........................................ 438/3
5,760,433 6/1998 Ramer et al. ............................. 257/295

*Primary Examiner*—Charles Bowers
*Assistant Examiner*—Craig Thompson
*Attorney, Agent, or Firm*—Burns, Doane, Swecker & Mathis, L.L.P.

[57] ABSTRACT

A method of manufacturing a ferroelectric memory of MFS- or MFIS-type includes the steps of forming on a substrate an insulating layer for preventing reaction at an interface between a ferroelectric material and a silicon substrate, forming a ferroelectric layer on the insulating layer, reacting a material of the insulating layer with a material of the ferroelectric layer, to transform the insulating layer into part of the ferroelectric layer, and forming an electrode on the ferroelectric layer. Since the insulating layer is formed between a substrate and a ferroelectric material, undesirable reaction between the two substances is prevented. The insulating layer is completely absorbed into the ferroelectric layer due to diffusion during deposition of the ferroelectric layer, to form an MFS-type ferroelectric memory. When some of the insulating layer remains, the ferroelectric memory becomes an MFIS-type. However, since the remaining insulating layer, which corresponds to the insulating layer of the MFIS-type ferroelectric memory, is very thin. Accordingly, characteristics of the MFIS-type ferroelectric memory improve.

13 Claims, 3 Drawing Sheets

METHOD OF MANUFACTURING FERROELECTRIC MEMORY

BACKGROUND OF THE INVENTION

1. Field of the Invention

The present invention relates to a method of manufacturing a ferroelectric memory, and more particularly, to a method of manufacturing a ferroelectric memory by which an insulating layer and a ferroelectric layer are stacked on a substrate, and the diffusion and absorption of the insulating layer into the ferroelectric layer are controlled, and thus a metal/ferroelectric/silicon (MFS) or metal/ferroelectric/insulator/silicon (MFIS) structure is formed, and by which undesirable reaction may be prevented at an interface between the ferroelectric material and a silicon substrate.

2. Description of the Related Art

Ferroelectric materials have attracted considerable attention for their application to non-volatile memory devices. In general, circuits using two transistors and two capacitors (2T2C) cells or one transistor and one capacitor (1T1C) cells are conventionally used for ferroelectric memory cells. A memory with ferroelectric floating gate field effect transistor (FET), named MFMIS (Metal/Ferroelectric/metal/Insulator/Semiconductor), has been suggested as a new type ferroelectric nonvolatile memory, in which a surface inversion layer is generated by the charge induced by the polarization of ferroelectric floating gate. Such a cell has several advantages, including a non-destructive read out and simple high-level integration due to 1Tr cell. However, considerably high operation voltage is required to overcome a voltage drop caused by the insulating layer.

Ferroelectric memory FET having a metal/ferroelectric/semiconductor (MFS) structure solve this problem. However, if the ferroelectric layer such as lead zirconate titanate (PZT) is deposited directly on a silicon substrate, diffusions of Pb, Ti and other elements into silicon substrate take place to form unnecessary phases such as silicate or silicide, so that it is impossible to manufacture a desired MFS type 1Tr memory cell.

FIG. 1 is a sectional view of a MFS-type ferroelectric memory.

Referring to FIG. 1, a ferroelectric PZT layer 12 is deposited on a silicon substrate 11, and a metal electrode 13 is formed on the ferroelectric layer 12.

In the MFS-type ferroelectric memory, a chemical reaction occurs between the ferroelectric layer 12 and the substrate 11 during deposition of the PZT layer 12, and thus undesirable substances such as silicate or silicide are generated at the interface of the ferroelectric material and the silicon. Here, the silicide is conductive, and thus a short may occur between a source and a drain. Also, because the silicate is a low dielectric material, it causes voltage drop problem described later. In case of using other ferroelectric materials such as $SrBi_2Ta_2O_9$, $CaBi_2Ta_2O_9$, $Bi_3TiNbO_9$ or $Bi_4Ti_3O_{12}$, similar reactions at the interface between the ferroelectric and substrate may occur, deteriorating ferroelectric characteristics and creating problems in FET operation.

Accordingly, as shown in FIG. 2, a metal/ferroelectric/insulator/silicon (MFIS) structure has been proposed to prevent undesirable reaction, where an insulating layer 22 is interposed between a substrate 21 and a ferroelectric layer 23. Reference numeral 24 indicates a metal electrode. Here, the insulating layer 22 is a buffer layer for preventing the chemical reaction. However, similarly to the MFMIS structure, the MFIS has two layers of insulating material connected in series, so that the operation voltage is shared between the ferroelectric layer 23 and the insulating layer 22, and the voltage available to the ferroelectric layer is less. Therefore, a higher operation voltage is required for operating the MFIS-type 1Tr than for the MFS. To avoid this, the thickness of the insulating layer 22 must be reduced to lower the voltage drop across the insulating layer 22. The thickness of the insulating layer can be most easily reduced during deposition. However, when the initial deposition thickness is 150 Å or less, the layer is unstable due to poor deposition technique and thus it is difficult to obtain a reproducible and stable device.

SUMMARY OF THE INVENTION

To solve the above problems, it is an object of the present invention to provide a method of manufacturing a MFIS-type ferroelectric memory which has a very thin insulating layer, capable of preventing undesirable reaction between a silicon substrate and a ferroelectric material.

The above method allows the MFS structure under optimal conditions.

To accomplish the above object, there is provided a method of manufacturing an MFS- or MFIS-type ferroelectric memory, comprising the steps of: forming on a substrate an insulating layer for preventing reaction at an interface between a ferroelectric material and a silicon substrate; forming a ferroelectric layer on the insulating layer; reacting a material of the insulating layer with a material of the ferroelectric layer, to transform the insulating layer into part of the ferroelectric layer; and forming an electrode on the ferroelectric layer.

In order to transform the oxide layer into a part of the ferroelectric layer without leaving undesirable material at the device, the insulating layer should be formed of a material selected from the group consisting of the materials of the ferroelectric layer deposited on it.

According to the present invention, an insulating layer is formed between a substrate and a ferroelectric material, to thereby prevent undesirable reaction. The insulating layer is absorbed into the ferroelectric layer due to diffusion during deposition of the ferroelectric layer, to create an MFS-type ferroelectric memory. Some of the insulating layer may remain, in which case, ferroelectric memory is an MFIS-type. However, the remaining insulating layer is very thin, to reduce the thickness of the insulating layer of the MFIS-type ferroelectric memory. Accordingly, performance of the MFIS-type ferroelectric memory increases.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
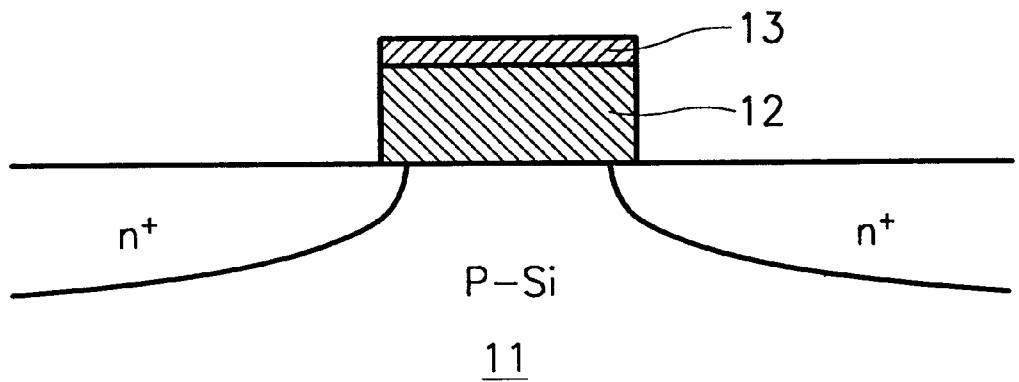
FIG. 1 is a sectional view of a typical MFS-type ferroelectric memory.
Figure 2:
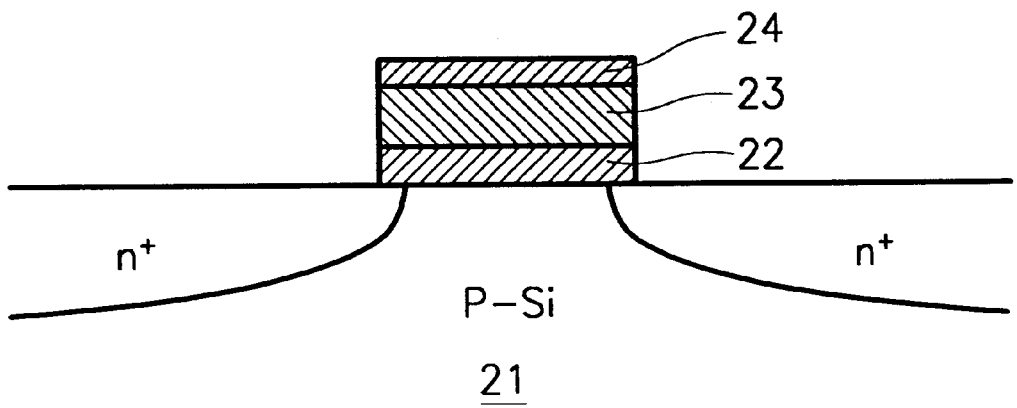
FIG. 2 is a sectional view of a typical MFIS-type ferroelectric memory.
Figure 3A:
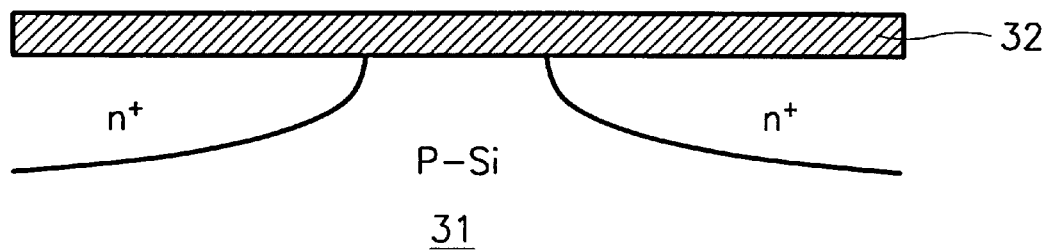
FIGS. 3A through 3D are sectional views showing stages in the formation of an MFS-type ferroelectric memory according to the present invention.
Figure 3B:
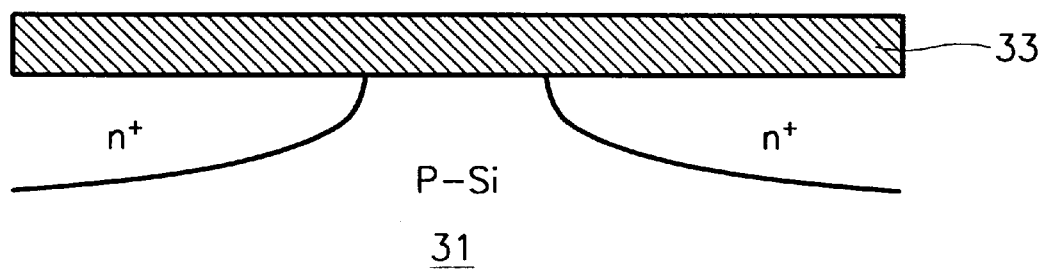
Figure 3C:
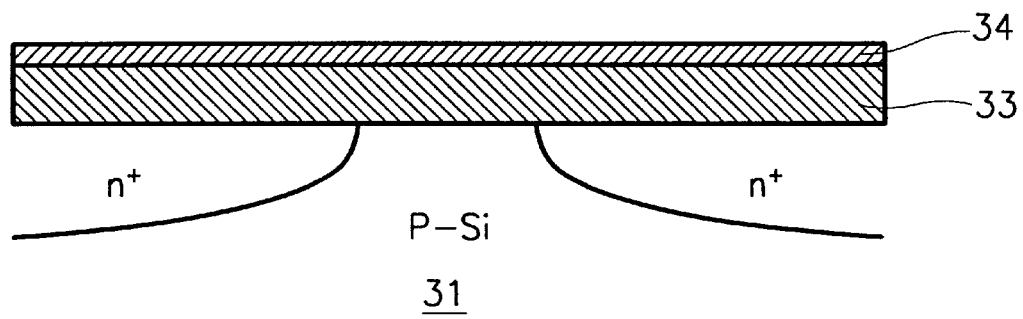
Figure 3D:
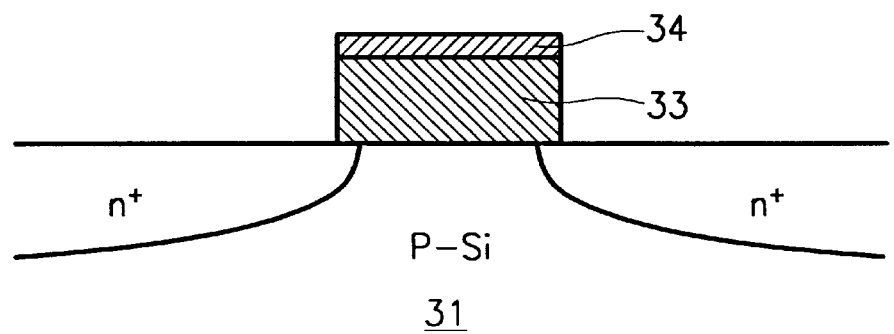

Referring to FIG. 3A, an insulating layer 32 is formed on a silicon substrate 31. Here, the insulating layer 32 may be deposited using chemical vapor deposition (CVD), sputtering, metal organic deposition (MOD), laser ablation, an electron beam method or an ion beam method, but preferably by a sol-gel method. The insulating layer 32 is initially formed to be 400 Å thick. A ferroelectric layer 33 is formed on the insulating layer 32. The ferroelectric layer 33 may be formed using an MOCVD, MOD, sputtering, laser ablation, electron beam or ion beam method, but preferably by a sol-gel method. Here, the methods other than the solgel and MOD method involve a high temperature process for depositing a thin film at high temperature without subsequent annealing to obtain a ferroelectric phase. The process of low temperature growth such as the sol-gel or MOD process causes mainly an amorphous layer, so the layer must be crystalized through annealing. By the sol-gel method, a subsequent annealing process is performed at approximately 550~650° C. At this time, when the ferroelectric layer 33 is deposited, the insulating layer 32 is removed and a very thin insulating layer and the ferroelectric layer 33 exist, as shown in FIG. 3B. At this time, the thickness of the final insulating layer is varied corresponding to the time and the temperature of annealing. However, if the thickness is at degree of 30~60 Å, the desirable voltage loss can be reduced. The MFS structure in which the insulating layer is completely removed can be realized under optimal conditions.

Here, the ferroelectric material may be formed of lead zirconate titanate ($PbZr_xTi_{1-x}O_3$;PZT) or a material of a layered structure group such as $SrBi_2Ta_2O_9$, $CaBi_2Ta_2O_9$, $Bi_3TiNbO_9$ or $Bi_4Ti_3O_{12}$. Here, when the ferroelectric material 33 is PZT, the insulating layer 32 may be formed of Ti, Zr, $ZrO_2$. Also, when the ferroelectric layer 33 is a material of a layered structure group such as $SrBi_2Ta_2O_9$, $CaBi_2Ta_2O_9$, $Bi_3TiNbO_9$ or $Bi_4Ti_3O_{12}$ the insulating layer 32 may be formed of Ti, Bi, Ta, Sr, Ti-oxide, Bi—Ti-oxide, Ta-oxide or Sr—Ti-oxide.

Here, in the case that the ferroelectric layer 33 is formed of PZT, and the insulating layer 32 is formed of Ti-oxide or Ti, the formation process of the ferroelectric layer 33 will be described as follows.

When the ferroelectric layer 33 grows, Ti or Ti-oxide of the insulating layer 32 are absorbed into the PZT as a part of the PZT layer without leaving other materials than PZT, therefore this process gradually reduce the insulating layer 32 without any foreign substance. When deposition conditions for the ferroelectric layer 33 and the thickness of the insulating layer 32 are appropriately selected, the insulating layer 32 is completely removed during growth of the ferroelectric layer 33. Accordingly, as shown in FIG. 3B, two layers of an MFS structure of electrode/ferroelectric material/silicon can be obtained. In general, the insulating layer 32 is preferably amorphous. This is because the amorphous phase is more stable as an insulating layer than the crystalline phase, since a crystalline layer includes defects such as grain boundary, and diffusions take place preferentially through these defects, which leads to nonuniform removal of the insulating layer. However, the crystalline phase in which a crystal growth direction is controlled to reduce the anisotropic property can be also used as an insulating layer.

According to a method of manufacturing a ferroelectric memory of the present invention, since an insulating layer is formed between a substrate and a ferroelectric material, undesirable reaction between the substrate and the ferroelectric material is suppressed. When the insulating layer is completely absorbed into the ferroelectric layer due to diffusion during deposition of the ferroelectric layer, an MFS-type ferroelectric memory is obtained. At this time, if some of the insulating layer remains, an MFIS-type ferroelectric memory is obtained. However, the remaining insulating layer is very thin, which results in a superior MFIS-type ferroelectric memory, with higher ferroelectric polarization at a predetermined applied voltage, and lower voltage operation.

What is claimed is:

1. A method of manufacturing a ferroelectric memory of MFS or MFIS-type, comprising the steps of:

a) forming on a substrate an insulating layer for preventing reaction at an interface between a ferroelectric material and a silicon substrate;

b) forming a ferroelectric layer on the insulating layer;

c) reacting a material of the insulating layer with a material of the ferroelectric layer, to transform the insulating layer into part of the ferroelectric layer; and d) forming an electrode on the ferroelectric layer, and wherein the insulating layer is formed of a material selected from the group of materials consisting of the ferroelectric layer.

2. The method of claim 1, wherein the insulating layer is formed by one selected from the group consisting of sol-gel, sputter and CVD methods.

3. The method of claim 1, wherein the ferroelectric layer is formed by one selected from the group consisting of sol-gel, sputter and MOCVD methods.

4. The method of claim 1, wherein the ferroelectric material is PZT.

5. The method of claim 1, wherein the ferroelectric material is a material of a layered structure group.

6. The method of claim 5, wherein the material of a layered structure group is one selected from the group consisting of $SrBi_2Ta_2O_9$, $CaBi_2Ta_2O_9$, $Bi_3TiNbO_9$ and $Bi_4Ti_3O_{12}$.

7. The method of claim 1, wherein the ferroelectric material is PZT, and the insulating layer is formed of one selected from the group consisting of Ti, Zr, $TiO_2$, $ZrO_2$.

8. The method of claim 1, wherein the ferroelectric material is $SrBi_2Ta_2O_9$, and the insulating layer is formed of one selected from the group consisting of Bi, Ta, Sr, Bi-oxide, Ta-oxide and Sr—Ti-oxide.

9. The method of claim 1, wherein the ferroelectric material is $CaBi_2Ta_2O_9$, and the insulating layer is formed of one selected from the group consisting of Ta, Bi, Bi-oxide, and Ta-oxide.

10. The method of claim 1, wherein the ferroelectric material is $Bi_3TiNbO_9$, and the insulating layer is formed of one selected from the group consisting of Bi, Ti-oxide, and Bi—Ti-oxide.

11. The method of claim 1, wherein the ferroelectric material is $Bi_4Ti_3O_{12}$, and the insulating layer is formed of one selected from the group consisting of Ti, Bi, Ti-oxide, and Bi—Ti-oxide.

12. The method of claim 1, wherein the step c) is performed simultaneously during forming the ferroelectric layer.

13. The method of claim 1, wherein the step c) is performed by annealing after forming the ferroelectric layer.

* * * * *